United States Patent [19]
Mahoney et al.

[11] Patent Number: 5,694,056
[45] Date of Patent: Dec. 2, 1997

[54] FAST PIPELINE FRAME FULL DETECTOR

[75] Inventors: John E. Mahoney; Stephen M. Trimberger, both of San Jose; Charles R. Erickson, Fremont, all of Calif.

[73] Assignee: Xilinx, Inc., San Jose, Calif.

[21] Appl. No.: 627,815

[22] Filed: Apr. 1, 1996

[51] Int. Cl.$^6$ ................................................. H03K 19/177
[52] U.S. Cl. ......................... 326/38; 326/40; 395/436
[58] Field of Search ............... 326/38–41; 364/490–491; 365/189.12; 395/430, 436

[56] References Cited

U.S. PATENT DOCUMENTS

| | | | |
|---|---|---|---|
| 5,144,166 | 9/1992 | Camarota et al. | 326/41 |
| 5,239,179 | 8/1993 | Tang et al. | 326/39 |
| 5,426,379 | 6/1995 | Trimberger | 326/39 |
| 5,444,847 | 8/1995 | Iitsuka | 395/287 |
| 5,469,003 | 11/1995 | Kean | 326/39 |
| 5,491,666 | 2/1996 | Sturges | 365/189.12 X |
| 5,493,239 | 2/1996 | Zlotnick | 326/38 |
| 5,543,730 | 8/1996 | Cliff et al. | 326/39 X |
| 5,563,592 | 10/1996 | Cliff et al. | 341/63 |
| 5,590,305 | 12/1996 | Terrill et al. | 395/430 |
| 5,600,845 | 2/1997 | Gilson | 395/800 |

*Primary Examiner*—David R. Hudspeth
*Attorney, Agent, or Firm*—Anthony C. Murabito; Jeanette S. Harms

[57] ABSTRACT

A pipeline frame full detection circuit. The present invention is operable within a system that loads configuration data into an integrated circuit (IC) using a serial data stream and transfer mechanism. Configuration data is transferred into the IC in sequential frames of a specified size for a given IC. The first bit of the configuration data contains a frame full indicator. The configuration data is transferred into a shift register circuit and the last bit position(s) of the shift register circuit, in addition to being stored in the shift register circuit, are shifted along a special frame full pipeline to a control unit. The control unit, upon detecting the frame full indicator, asserts a parallel write command that causes the data of the shift register circuit to be parallel transferred to a receiving column of memory. New configuration data can then be serially shifted into the same shift register circuit after a reset signal. By shifting the frame full indicator through a pipeline, the propagation delay required for the frame full indicator to reach the control unit is significantly reduced. It is this propagation delay that limits the transfer rate of the configuration data into the IC. Therefore, the present invention advantageously reduces this limiting factor.

22 Claims, 6 Drawing Sheets

FAST PIPELINE FRAME FULL DETECTOR

BACKGROUND OF THE INVENTION

1. Field of the Invention

The present invention relates to the field of mechanisms for detecting an information frame full signal. Specifically, the present invention can be applied within the field of programmable integrated circuits (ICs), such as field programmable gate arrays (FPGAs).

2. Related Technology

FIG. 1 illustrates a frame full detection circuit within a programmable IC. During initialization, configuration information represented as a bit stream is serially loaded ("downloaded") into IC 90 over line 60 using an external pin or pins of IC 90. This configuration information programs configurable logic blocks (CLBs), input/output blocks (IOBs), and programmable interconnections between CLBs and IOBs.

The configuration information is downloaded into IC 90 in frames of varying size. A frame can vary in size depending on the IC that receives the information. For IC 90, the frame is serially loaded through a series of interconnected latches that form a shift register 10. Shift register 10 is included within a receiving memory 20. Each latch of shift register 10 is clocked by a common source 35. The last latch 10a of shift register 10 outputs a frame full signal over line 45 to a control unit 40 that controls reception of the configuration information. Control unit 40 communicates write enable and reset control signals over bus 55 back to receiving memory 20.

When a complete frame of information is serially loaded into shift register 10, a frame full detection signal is broadcast over line 45 and control unit 40 causes this frame of information to be transferred, in parallel, to an individual column of memory 30 by asserting a write enable over bus 55. As is known in the art, data held within these columns of memory 30 is used to configure IC 90.

Upon the transfer of information from column 10 to column 30, control unit 40 generates a reset signal over bus 55 to zero-reset each latch in shift register 10. The first bit of each frame of configuration information contains a logic "1" to indicate the start of the frame. This "1" is used by the last latch, 10a, to indicate a frame full signal which is communicated over line 45.

While offering an effective frame full detection mechanism, the prior art mechanism of FIG. 1 contains a drawback related to the length of line 45. The control unit 40 is typically located relatively far away from latch 10a. With high performance data transfer, the propagation time of the frame full signal from latch 10a to control unit 40 along line 45 constitutes a limiting factor in obtaining higher data transfer rates. This is the case because detection of the frame full signal by the control unit triggers loading of the received data into a memory column 30. Therefore, the delay associated with the above detection is a limiting factor regarding how fast individual bits can be shifted into the shift register 10.

Therefore a need arises for a frame full detection mechanism that reduces the impact of this limiting factor to allow higher data transfer rates. The present invention offers such advantageous functionality.

Accordingly, the present invention provides a mechanism and method for providing high speed data transfer of configuration information into a programmable integrated circuit. More specifically, the present invention advantageously reduces the impact of the limiting factor that is disclosed above in order to allow the above referenced high speed data transfer rates. These and other advantages of the present invention are discussed in more detail herein.

SUMMARY OF THE INVENTION

A pipeline frame full detection circuit is described. The present invention is operable within a system that loads configuration data into an integrated circuit (IC) using a serial data stream and transfer mechanism. Configuration data is transferred into the IC in sequential frames of specified size for a given IC. The first bit of the configuration data contains a frame full indicator. The configuration data is transferred into a shift register circuit and the last bit position(s) of the shift register circuit, in addition to being stored in the shift register circuit, are shifted along a special frame full pipeline to a control unit. The control unit, upon detecting the frame full indicator, asserts a parallel write command that causes the data of the shift register circuit to be parallel transferred to a receiving column of memory. New configuration data is then serially shifted into the same shift register circuit after a reset signal. By shifting the frame full indicator through a pipeline channel, the propagation delay required for the frame full indicator to travel to reach the control unit from the pipeline is significantly reduced. It is this propagation delay that limits the transfer rate of the configuration data into the IC. The present invention advantageously spreads the propagation delay over several pipeline clock cycles to reduce this limiting factor.

Specifically, embodiments of the present invention include an integrated circuit for receiving a frame of information over a first line, the integrated circuit having: a shift register having a plurality of serial connected flip-flop elements coupled to a clock, the shift register coupled to receive the frame of information over the first line; a frame full pipeline coupled to an output of a particular flip-flop element of the plurality of memory cells, the particular flip-flop element located n flip-flop elements from the last flip-flop element of the shift register; wherein the frame full pipeline comprises n flip-flop elements coupled in serial fashion and clocked by the clock; and a control unit coupled to the frame full pipeline for receiving a frame full indicator from the frame full pipeline when the frame of information is fully loaded into the shift register.

DETAILED DESCRIPTION OF THE DRAWINGS

Figure 1:
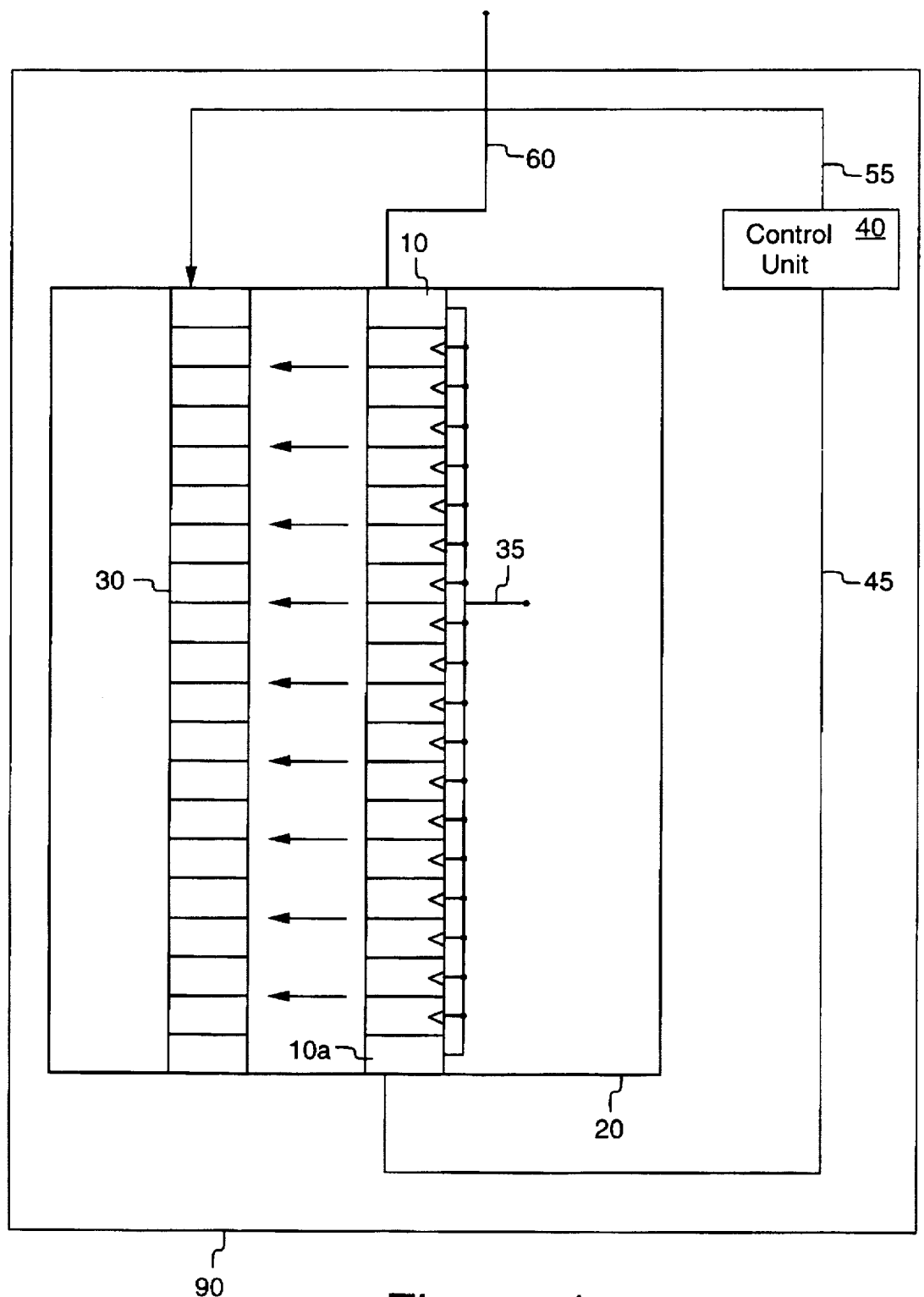
FIG. 1 is a schematic diagram of a prior art frame full detection circuit.
Figure 2:
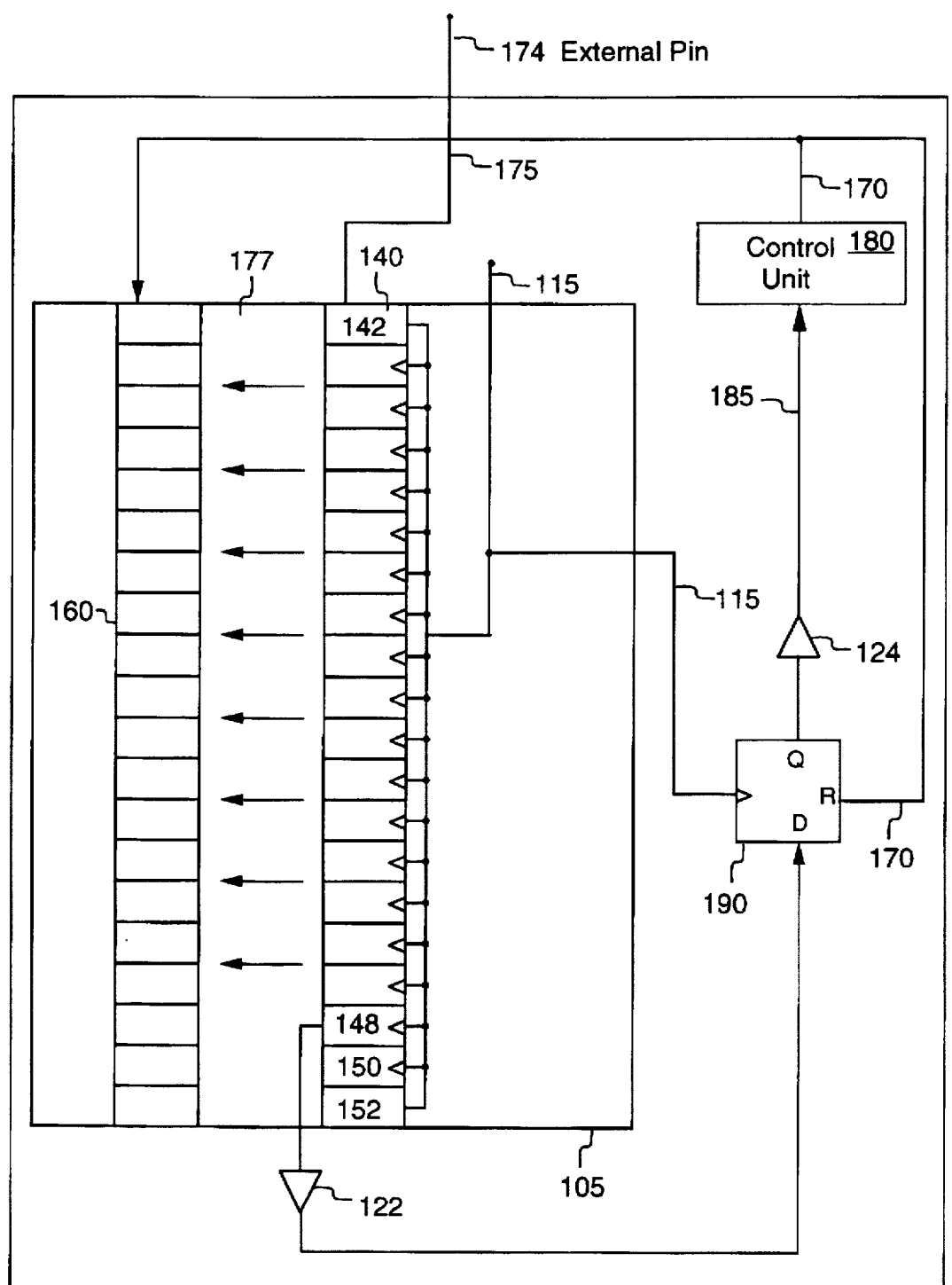
FIG. 2 is a schematic diagram of a fast frame full detection circuit in accordance with an embodiment of the present invention having a one cycle frame full pipeline.

FIG. 2 illustrates an embodiment of the present invention frame full signal detection circuit having a single cycle pipeline. The present invention advantageously provides the pipeline for the frame full detection signal line to effectively reduce the propagation length and time for the frame full signal to reach a control unit. The pipeline mechanism is described below.

FIG. 2 illustrates components of a portion 110 of a programmable integrated circuit, such as an FPGA. Portion 110 receives configuration information (i.e. a serial bit stream) via one or more external input pins 174 over line 175. The serial bit stream is loaded into a shift register 140 which includes a number of serially coupled sequential memory elements (e.g., flip-flops).

The first or receiving flip-flop element is element 142. The third to the last, second to the last, and last flip-flops are elements 148, 150 and 152, respectively. As shown, each flip-flop of shift register 140 is clocked by a clock signal received over a line 115. A memory column 160 is coupled to receive the contents of shift register 140 using a parallel transfer mechanism over lines 177. In other embodiments of the present invention, other memory columns 160 (not shown) are provided to receive other contents from shift register 140. Lines 177 couple the Q outputs of each flip-flop of shift register 140 to the data input of the memory cells of one of the memory columns 160.

Control unit 180 is coupled to memory 105 using a bus 170. Bus 170 carries a write enable signal (WE) that causes the bits of shift register 140 to be written in parallel to the cells of one of the memory columns 160. Bus 170 also contains a reset signal (170RE) that, when asserted, zero resets all of the flip-flops of shift register 140. Control unit 180 receives a frame full indicator signal over line 185. According to the present invention, control unit 180 can be implemented using any number of well known designs.

An external transmitter unit (not shown) coupled to external pin 174 supplies the serial bit stream of configuration data. The external transmitter does not pause the serial The output signal of flip-flop 190 is optionally buffered by buffer 124 and fed over line 185 to control unit 180. Flip-flop 190 is clocked by a clock signal received over line 115, the same signal that clocks shift register 140 and reset by the RE signal from bus 170. According to this embodiment, the frame full pipeline consists of flip-flop 190.

Figure 3:
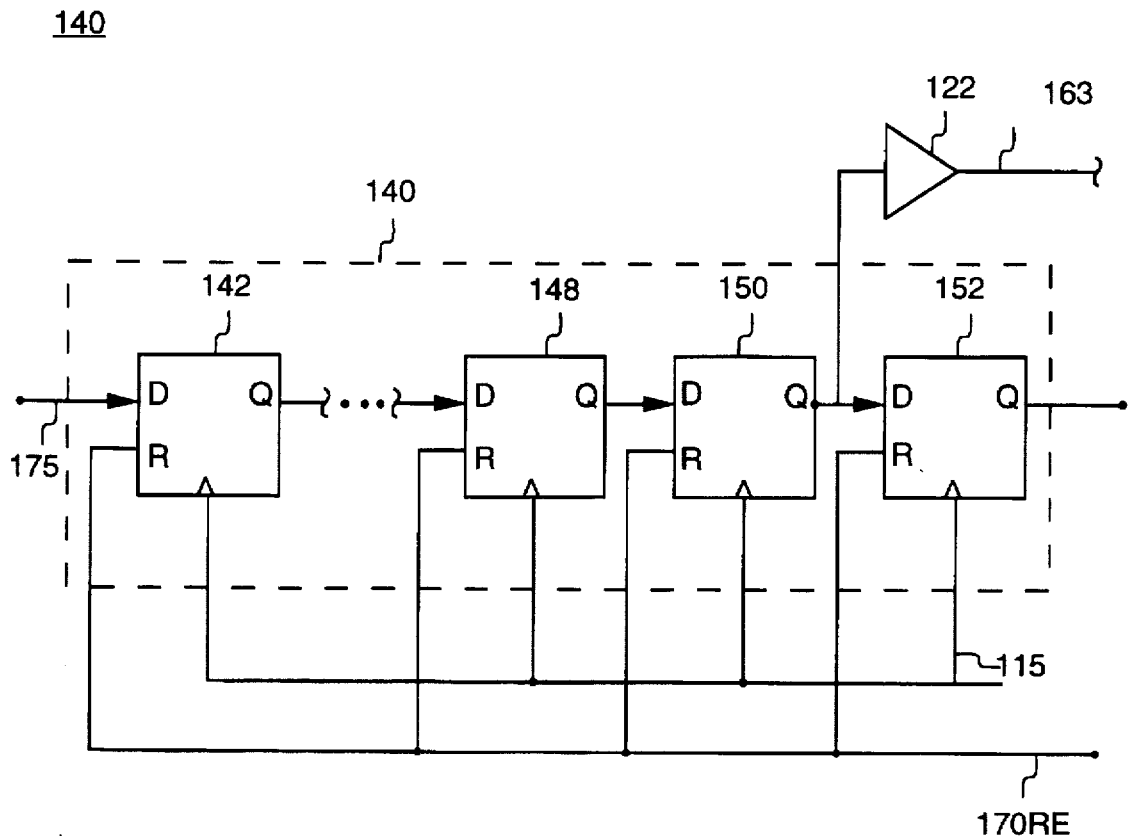
FIG. 3 is a schematic diagram of a portion of the present invention circuit shown in FIG. 2 for providing the frame full indicator to the frame full indicator pipeline.

FIG. 3 illustrates some of the connections of the flip-flop elements of shift register 140 in greater detail. As shown, each flip-flop 142 . . . , 148, 150 and 152 are coupled in shift register configuration. Each flip-flop's clock input terminal is coupled to clock line 115. The reset (R) terminal of each flip-flop is coupled to a reset line 170RE of bus 170 (FIG. 2). The D input terminal of each flip-flop is coupled to the Q output terminal of the previous flip-flop. The first input terminal of shift register 140 (e.g., the D input of flip-flop 142) is coupled to serial data input line 175. In the embodiment of FIG. 2, optional buffer 122 is coupled to the Q output terminal of flip-flop 150. The Q output terminal of flip-flop 150 is also coupled to the D input terminal of last flip-flop 152 to complete the frame of data within shift register 140.

Referring to FIG. 2 and FIG. 3, before a valid frame of configuration data is loaded into shift register 140, control unit 180 asserts the reset line 170RE of bus 170 to zero reset the flip-flop elements of shift register 140. It is appreciated that each frame of data contains a logic "1" (e.g., frame full indicator) at the beginning of each frame of data. Table I below illustrates a sample frame transmission with a leading "1" as the frame full indicator. Bits of configuration data of a frame are then loaded over line 175 in a serial fashion into shift register 140. The leading "1" in the frame is shifted through each flip-flop at each clock cycle until it reaches flip-flop 150. At the clock edge, the content of flip-flop 150 (e.g., the frame full indicator) is asserted over its Q output. This signal is transferred to the D input terminals of both flip-flop 152 and flip-flop 190.

```
                                                          FRAME   FULL
   +---------------------------------------------+----------
   |  <---- F R A M E   D A T A -------->  |    1  |
   +---------------------------------------------+----------
      <END                                              START>
``` bit stream while the shift register 140 is copying data into one of the memory columns 160 (e.g., a memory transfer cycle). Instead, a series of bits are inserted by the external transmitter between frames and this sequence is synchronized to occur over pin 174 during each memory transfer cycle. The series of idle bits can contain error checking fields in one embodiment but generally may not contain the frame full indicator. Since the frame full indicator precedes each frame of data, any extra idle bits received within shift register 140 are shifted out and ignored in advance of the next memory transfer cycle. It is appreciated that the number of idle bits is determined such that the length of time required to transmit the idle bits exceeds the time required load the shift register 140 data into one of the memory columns 160.

In accordance with this embodiment of the present invention, the output signal of flip-flop element 150 is optionally buffered by buffer 122 and provided to the input terminal of pipeline flip-flop 190 (D-flip flop) over line 163.

In this configuration, flip-flop 150 asserts its output signal one clock cycle before the output signal is asserted over the output of flip-flop 190. The frame full signal is carried over line 163 to the input of flip-flop 190. Therefore, one half of the propagation time to get the frame full indicator from shift register 140 to control unit 180 is performed in the clock cycle just before the output signal is asserted over the output of flip-flop 190. In other words, one half of the propagation time to get the frame full indicator from shift register 140 to control unit 180 is performed in the clock cycle just before the frame is full. On the next clock cycle, the frame full indicator signal is latched into flip-flop 190, asserted over its Q output terminal, optionally buffered by buffer 124 and asserted over line 185 to control unit 180.

Upon receiving the frame full indicator signal, control unit 180 asserts the WE signal which causes the contents of shift register 140 to be parallel transferred to one of the memory columns 160. While this memory transfer is occurring, the external transmitter unit is transmitting a sequence of arbitrary bits. Next, control unit 180 asserts a reset signal over line 170RE of bus 170 to zero reset the shift register 140 and flip-flop 150 in preparation for a new frame of configuration data. The next frame of data (which may be preceded by some trailing arbitrary bits) is then shifted into shift register 140 over line 175 with a leading "1" as the frame full indicator.

By providing flip-flop 190 and taking the output of shift register 140 from flip-flop 150, in lieu of flip-flop 152, the present invention effectively provides a one cycle pipelining of the frame full signal that reduces in half the propagation delay of the frame full signal from shift register 140 to control unit 180. In accordance with this embodiment of the present invention, the propagation delay associated with the frame full indicator is measured from the Q output terminal of cell 190, instead of from the Q output terminal of flip-flop 152, to control unit 180.

Figure 4:
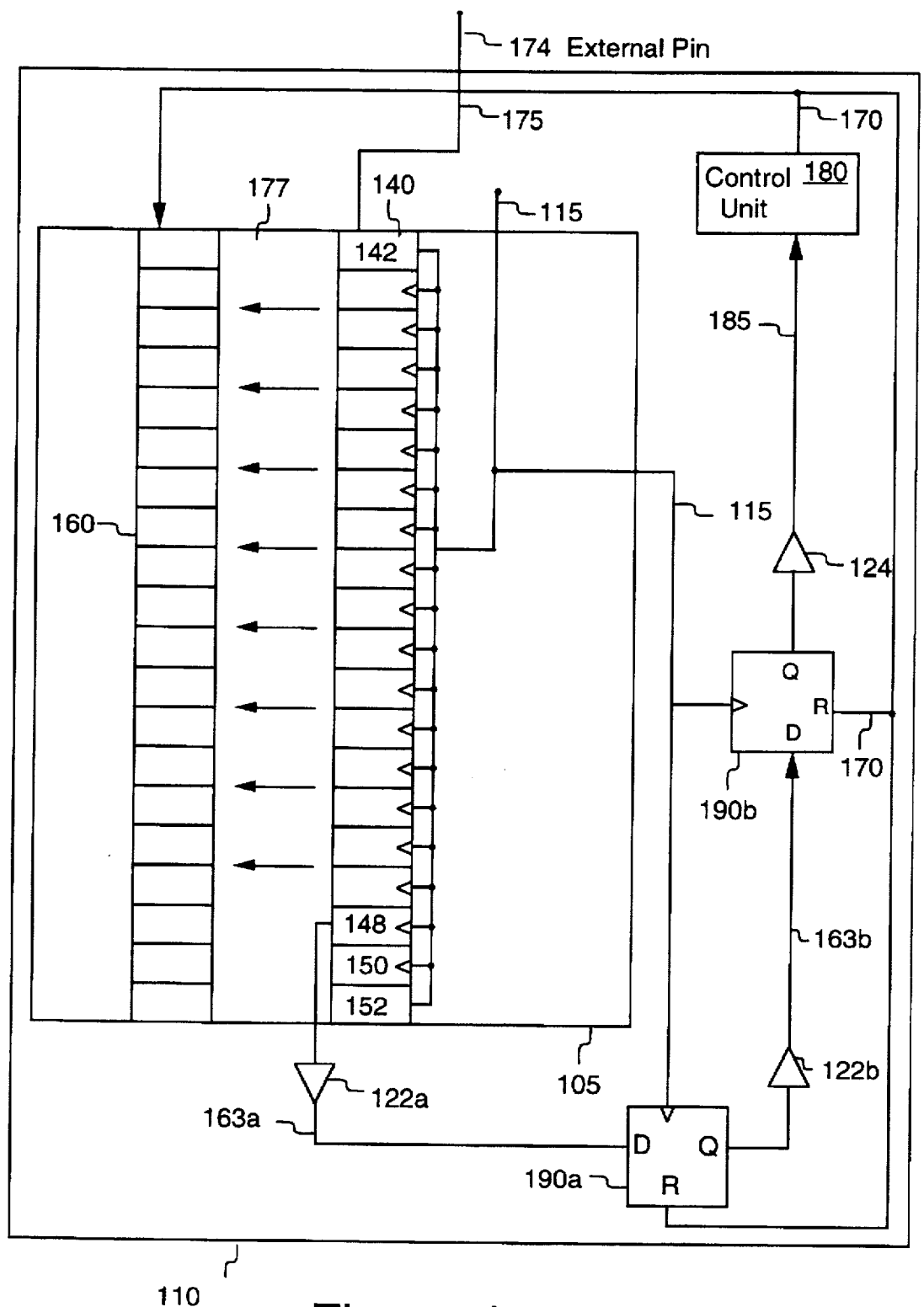
FIG. 4 is a schematic diagram of a fast frame full detection circuit in accordance with an embodiment of the present invention having a more than one cycle frame full pipeline.
Figure 5:
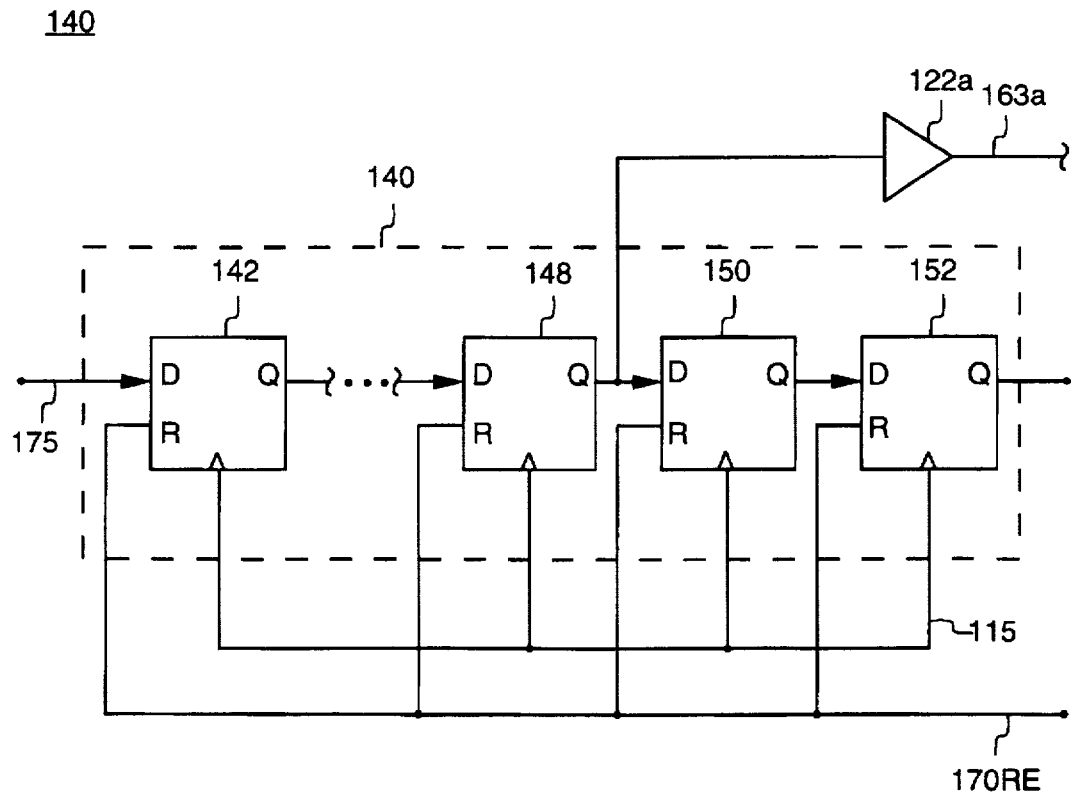
FIG. 5 is a schematic diagram of a portion of the present invention circuit shown in FIG. 4 for providing the frame full indicator to the frame full indicator pipeline.

FIG. 4 and FIG. 5 represent another embodiment of the present invention having more than one cycle in the frame full pipeline. Except for the discussions that indicate the differences between the embodiments of FIG. 2 and FIG. 4, the two embodiments are assumed to be analogous.

According to the embodiment of FIG. 4, a frame full pipeline consists of flip-flop 190a and flip-flop 190b. The Q output signal of flip-flop 148 is optionally buffered by a buffer 122a and provided on a line 163a. Line 163a is coupled to the D input terminal of flip-flop 190a. The Q output signal of flip-flop 190a is optionally buffered by buffer 122b and provided to the D input of flip-flop 190b via line 163b. The output signal of flip-flop 190b is optionally buffered by buffer 124 and provided to control unit 180 via line 185. Flip-flops 190a and 190b are clocked by the signal over line 115 which is common to shift register 140.

FIG. 5 illustrates the certain portions of the shift register 140 in the embodiment shown in FIG. 4 in more detail. In this embodiment, optional buffer 122a is coupled to the Q output terminal of flip-flop 148. The Q output terminal of flip-flop 148 is also coupled to the D input terminal of the second to the last flip-flop 150 which is coupled to the last flip-flop 152 to complete the frame of data within shift register 140.

In operation, the frame of configuration data is serially loaded into shift register 140 that has been zero-reset. The frame full indicator "1" is shifted into cell 142 and progressively shifted through the shift register 140 until it is shifted and clocked into flip-flop 148 which causes the Q output signal of flip-flop 148 to assert the frame full indicator to the D input terminal of flip-flop 150 and also to the D input terminal of pipeline flip-flop 190a. On the next clock cycle, the frame full indicator is asserted over the Q output terminal of flip-flop 150 and also over the Q output terminal of flip-flop 190a.

Two thirds of the propagation time to get the frame full indicator from shift register 140 to control unit 180 is performed in the two clock cycles just before the output signal is asserted over the output of flip-flop 190b. In other words, two thirds of the propagation time to get the frame full indicator from shift register 140 to control unit 180 is performed in the two clock cycles just before the frame is full. On the next clock cycle, the frame full indicator signal is latched into flip-flop 190b, asserted over its Q output terminal, optionally buffered by buffer 124 and asserted over line 185 to control unit 180.

Upon receiving the frame full indicator signal, control unit 180 asserts the WE signal which causes the contents of shift register 140 to be parallel transferred to a memory column of 160. Next, control unit 180 asserts a reset signal over line 170RE to zero reset shift register 140 and flip-flops 190a and 190b in preparation for a new frame of configuration data. The next frame of data is then shifted into shift register over line 175 with a leading "1" as the frame full indicator.

By inserting flip-flops 190a and 190b, and taking the output signal from flip-flop 148, in lieu of flip-flop 152, the present invention effectively provides a two cycle pipeline for the frame full signal that reduces by two thirds the propagation delay of the frame full signal from shift register 140 to control unit 180. In accordance with this embodiment of the present invention, the propagation delay associated with the frame full indicator is measured from the Q output terminal of flip-flop 190b, instead of from the Q output terminal of flip-flop 152, to the input terminal of control unit 180.

Therefore, the embodiment of FIG. 2 provides one cycle of pipelining, whereas the embodiment of FIG. 4 provides two cycles of pipelining in the frame full indication path. In accordance with the present invention, any number of additional cycles, n, can be added to the frame full pipeline to further decrease the propagation delay. For an embodiment of n cycles, the frame full pipeline would take its output from the nth cell from the last flip-flop 150 of shift register 140.

Instead of the frame full indicator being a logical "1" and the cells of the shift register of the present invention being zero-reset upon a new frame, an alternative embodiment also includes the frame full indicator being a logical "0" and the cells of the shift register being reset to "1" upon a new frame.

Figure 6:
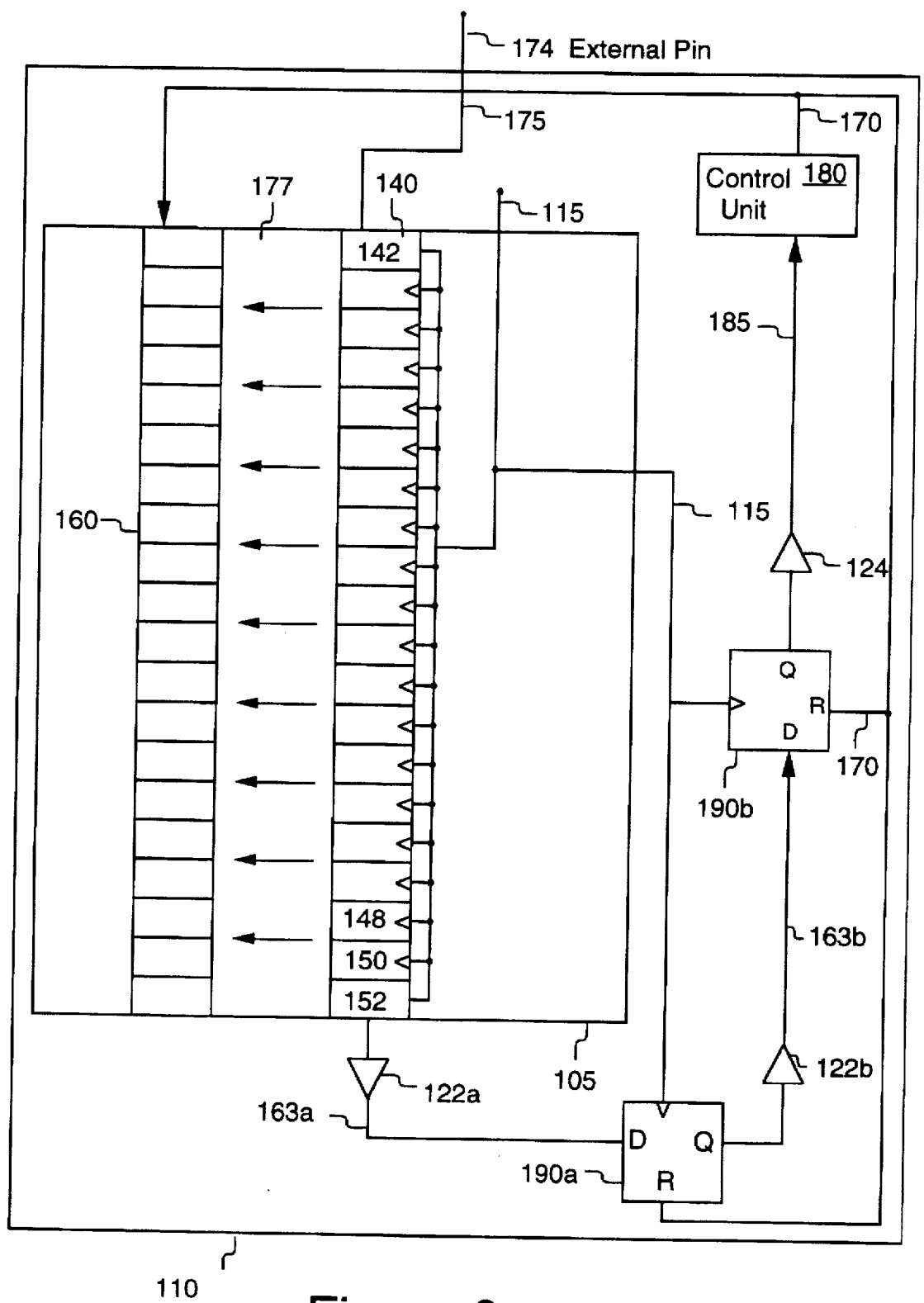
FIG. 6 is a schematic diagram of an alternative embodiment of the present invention frame full pipeline using idle bit(s).

FIG. 6 illustrates an alternative embodiment of the frame full pipeline. In this embodiment, buffer 122a is directly coupled to receive the Q output of the last flip-flop of shift register 140, flip-flop element 152. In this embodiment, the frame full indicator is still shifted through the frame full pipeline (flip-flops 190a, 190b) to the control unit, however the frame full indicator enters the pipeline from the last flip-flop (e.g., 152) instead of from the nth flip-flop from the last (e.g., 148).

In the embodiment of FIG. 6, assuming the frame full pipeline is composed of n serially coupled flip-flop elements, each frame full indicator is followed by n idle bits; in the case shown n=2, but n can be any value larger than zero. During shifting, the n idle bits fill the frame full pipeline (having n flip-flops) and are positioned behind the frame full indicator, with the frame full indicator being the first bit to reach the control unit 180; at this time, the frame of data is shifted from the control register 140 to one column of column memory 160. Each frame of data has (1) a frame full indicator followed by (2) n idle bits followed by (3) the frame's data bits.

Although this embodiment reduces the propagation delay of the frame full indicator, it is somewhat slower than the embodiment of FIG. 4 because n extra clock cycles are required to fill a frame. However, as with the embodiment of FIG. 4, each clock cycle of FIG. 6 is shorter as compared with the prior art. If T is assumed to be the period of each clock cycle and each frame is assumed to be 200 bits, the frame transfer time of the embodiment of FIG. 4 is 200T while the frame transfer time of the embodiment of FIG. 6 is (200+n)T due to the n idle bits. Depending on the number of states in the frame full pipestage, T of the present invention can be much shorter in duration compared to the maximum clock rate of the prior art.

Within the embodiments of the present invention described herein, although described as flip-flop elements, the sequential elements of the shift register 140 or the frame full pipeline of the present invention can be realized using D flip-flops, SR flip-flops, JK flip-flops, or T flip-flops. The sequential elements can also be realized using a number of other well known clocked memory cells or latch circuit elements within the scope of the present invention.

The preferred embodiment of the present invention, a fast frame full indicator circuit using a frame full indicator pipeline, is thus described. While the present invention has been described in particular embodiments, it should be appreciated that the present invention should not be construed as limited by such embodiments, but rather construed according to the below claims.

What is claimed is:

1. An integrated circuit for receiving a frame of information over a first line, said integrated circuit comprising:
    (a) a shift register having a plurality of serially configured sequential memory elements coupled to a clock, said shift register coupled to receive said frame of information over said first line;
    (b) a frame full pipeline coupled to an output of a particular sequential memory element of said plurality of sequential memory elements, said particular sequential memory element located n sequential memory elements from the last sequential memory element of said shift register;
    wherein said frame full pipeline comprises n sequential memory elements coupled in serial fashion and clocked by said clock; and
    (c) a control unit coupled to said frame full pipeline for receiving a frame full indicator from said frame full pipeline when said frame of information is fully loaded into said shift register.

2. An integrated circuit as described in claim 1 wherein said plurality of serially configured sequential memory elements of said shift register and said sequential memory elements of said frame full pipeline are flip-flops.

3. An integrated circuit as described in claim 2 wherein said frame full indicator is a logical "1" located at the start of said frame of information.

4. An integrated circuit as described in claim 2 wherein said frame full pipeline is disposed between said control unit and said shift register to reduce propagation time of said frame full indicator to said control unit.

5. An integrated circuit as described in claim 1 further comprising a memory column coupled to receive said frame of information from said shift register in parallel and wherein said control unit is also for generating a write enable signal causing said frame of information to be written into said memory column upon said control unit receiving said frame full indicator.

6. An integrated circuit for receiving a frame of information over a first line, said integrated circuit comprising:
    (a) a shift register having a plurality of serial flip-flops coupled to a clock, said shift register coupled to receive said frame of information over said first line;
    (b) a frame full pipeline coupled to an output of a particular flip-flop of said plurality of flip-flops, wherein said frame full pipeline is disposed between a control unit and said shift register to reduce propagation delay of a frame full indicator in reaching said control unit; and
    (c) said control unit coupled to said frame full pipeline for receiving said frame full indicator from said frame full pipeline when said frame of information is fully loaded into said shift register.

7. An integrated circuit as described in claim 6 wherein said frame full indicator is followed by n idle bit(s) positioned between said frame full indicator and frame information.

8. An integrated circuit as described in claim 7 wherein said frame full pipeline comprises n serially coupled flip-flops and said particular flip-flop is the last flip-flop of said shift register.

9. An integrated circuit as described in claim 6 wherein said particular flip-flop is located n flip-flops from the last flip-flop of said shift register and wherein said frame full pipeline comprises n serially coupled flip-flops clocked by said clock.

10. An integrated circuit as described in claim 9 wherein said plurality of flip-flops of said shift register and said flip-flops of said frame full pipeline are D flip-flop circuits.

11. An integrated circuit as described in claim 9 wherein said frame full indicator is a logical "1" located at the start of said frame of information.

12. An integrated circuit as described in claim 9 further comprising a memory column coupled to receive said frame of information from said shift register in parallel and wherein said control unit is also for generating a write enable signal causing said frame of information to be written into said memory column upon receiving said frame full indicator.

13. An integrated circuit for receiving a frame of information over a first line, said integrated circuit comprising:
    (a) a shift register having a plurality of serial flip-flops coupled to a clock, said shift register coupled to receive said frame of information over said first line;
    (b) a frame full pipeline coupled to an output of a particular flip-flop of said plurality of flip-flops, said particular flip-flop located n flip-flops from the last flip-flop of said shift register,
    wherein said frame full pipeline comprises n flip-flops coupled in serial fashion and clocked by said clock, said frame full pipeline for reducing propagation delay of a frame full indicator in reaching a control unit;
    (c) said control unit coupled to said frame full pipeline for receiving said frame full indicator from said frame full pipeline when said frame of information is fully loaded into said shift register; and
    (d) a memory column coupled to receive said frame of information from said shift register in parallel and wherein said control unit is also for generating a write enable signal causing said frame of information to be written into said memory column upon said control unit receiving said frame full indicator.

14. An integrated circuit as described in claim 13 wherein said control unit also generates a reset signal for resetting said plurality of flip-flops of said shift register and said frame fully pipeline in advance of receiving a new frame of information.

15. An integrated circuit as described in claim 13 wherein said plurality of flip-flops of said shift register and said flip-flops of said frame full pipeline are D flip-flop circuits.

16. An integrated circuit as described in claim 13 wherein said frame full indicator is a logical "1" located at the start of said frame of information.

17. An integrated circuit as described in claim 13 wherein said information is configuration information.

18. A programmable integrated circuit device having an embedded circuit for receiving a frame of configuration bits over an external line, said embedded circuit comprising:

(a) a shift register having a plurality of serial flip-flops coupled to a clock, said shift register coupled to receive said frame of configuration bits in serial fashion over said external line;

(b) a frame full pipeline coupled to an output of a particular flip-flop of said plurality of flip-flops, wherein said particular flip-flop is located n flip-flops from the last flip-flop of said shift register and wherein said frame full pipeline comprises n flip-flops coupled in serial fashion and clocked by said clock; and (c) a control unit coupled to said frame full pipeline for receiving a frame full indicator from said frame full pipeline when said frame of configuration bits is fully loaded into said shift register.

19. A programmable integrated circuit as described in claim 18 wherein said frame full pipeline is disposed between said control unit and said shift register to reduce propagation delay of a frame full indicator in reaching said control unit.

20. A programmable integrated circuit as described in claim 18 further comprising a memory column coupled to receive said frame of configuration bits from said shift register in parallel and wherein said control unit is also for generating a write enable signal causing said frame of configuration bits to be written into said memory column upon receiving said frame full indicator.

21. A programmable integrated circuit as described in claim 18 wherein n is equal to 1.

22. A programmable integrated circuit as described in claim 18 wherein n is greater than 1.

* * * * *